United States Patent

[11] 3,619,733

[72] Inventor William John Greig
Somerville, N.J.
[21] Appl. No. 850,822
[22] Filed Aug. 18, 1969
[45] Patented Nov. 9, 1971
[73] Assignee RCA Corporation

[54] SEMICONDUCTOR DEVICE WITH MULTILEVEL METALIZATION AND METHOD OF MAKING THE SAME

5 Claims, 5 Drawing Figs.

[52] U.S. Cl. .......... 317/234 R,
317/234 M, 317/234 N, 317/234 E
[51] Int. Cl. .......... H01l 5/06
[50] Field of Search .......... 317/234
(5.3), 234 (5.2), 234 (5.4), 234 (3), 235 (22),
234, 235, 230, 258

[56] References Cited

UNITED STATES PATENTS

| | | | |
|---|---|---|---|
| 2,448,513 | 9/1948 | Brennan | 317/230 |
| 3,432,918 | 3/1968 | Riley | 29/570 |
| 3,434,020 | 3/1969 | Ruggiero | 317/235 |
| 3,411,122 | 11/1968 | Schiller | 338/262 |

*Primary Examiner*—John W. Huckert
*Assistant Examiner*—Martin H. Edlow
*Attorney*—Glenn H. Bruestle

ABSTRACT: A semiconductor device including a flat wafer of a semiconductor material, a first level metallization pattern on the wafer, a dielectric on the wafer and covering the first level metallization pattern, and a second level metallization pattern on the dielectric. The dielectric comprises a layer of a plastic coated on the wafer and covering the first level metallization pattern and a layer of silicon oxide coated on the plastic layer. The second level metallization pattern is on the silicon oxide layer.

INVENTOR.
WILLIAM J. GREIG
BY
ATTORNEY

SEMICONDUCTOR DEVICE WITH MULTILEVEL METALIZATION AND METHOD OF MAKING THE SAME

BACKGROUND OF INVENTION

The present invention relates to a semiconductor device having multilevel metallization patterns thereon. In particular, the present invention relates to a dielectric for insulating multilevel metallization patterns on a semiconductor device.

Many types of semiconductor devices, such as integrated circuits, include metallization patterns on a semiconductor wafer to electrically interconnect the various parts of the circuit formed in the wafer. It is often required that various portions of the metallization cross each other in order to make the desired interconnections. To permit the crossover, it is the practice to provide the metallization in multilevels with a dielectric between the levels so as to electrically insulate the levels from each other. Heretofore, the dielectric generally used is a layer of silicon oxide. However a problem in using a silicon oxide dielectric is that the manner of forming the silicon oxide dielectric layer often creates pinholes in the dielectric layer. Such pinholes create undesired interconnections between the levels of the metallization patterns. Attempts have been made to use a plastic for a pinhole-free dielectric between the metallization layers. However many of the plastics which are suitable for use as the dielectric layer have a disadvantage that the metal layers do not adhere well to the plastic. Therefore it is desirable to have a dielectric for use between the metallization levels which is free of pinholes and to which the metallization patterns will adhere.

SUMMARY OF THE INVENTION

A semiconductor device including a body of a semiconductor material having a first metal film thereon. A layer of a plastic is on the body and extends over the first metal film. A layer of silicon oxide is on the plastic layer, and a second metal film is on the silicon oxide layer.

DETAILED DESCRIPTION

Figure 1:
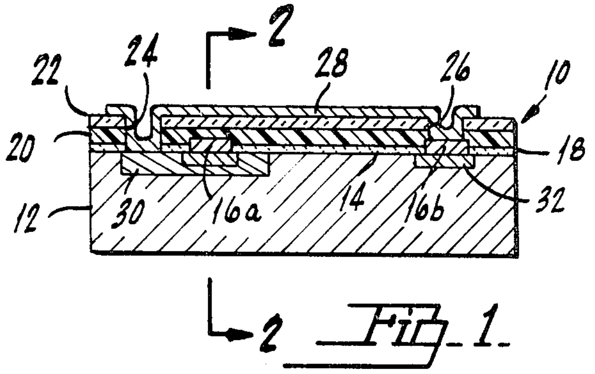
FIG. 1 is a sectional view of an embodiment of the semiconductor device of the present invention.
Figure 2:
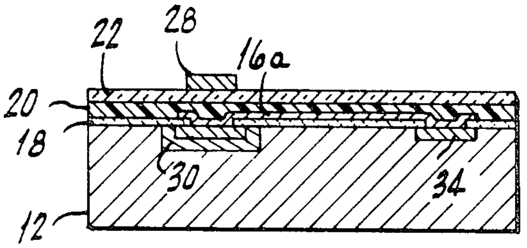
FIG. 2 is a sectional view taken along line 2—2 of FIG. 1.

Referring initially to FIGS. 1 and 2, an embodiment of the semiconductor device of the present invention is generally designated as 10. Semiconductor device 10 comprises a body 12, e.g., a flat wafer, of a semiconductor material, such as silicon, having in one surface 14 thereof a plurality of active devices, such as transistor 30 and diodes 32 and 34. On the surface 14 of the wafer 12 is a thin layer 18 of silicon oxide. The silicon oxide layer 18 has openings therethrough where contact to an active device in the wafer 12 is to be made. A film of an electrically conductive metal, such as aluminum, in the form of a pattern of narrow strips, such as strips **16*a* and 16*b*, is provided on the silicon dioxide layer 18 and extend into the openings in the silicon dioxide layer so as to contact the surface 14 of the wafer 12. Although only two metallization strips are shown on the surface 14 of the wafer 12**, the metallization pattern can include any number of such strips which are necessary to make the desired interconnections as long as the strips do not have to cross any other strips.

A layer 20 of a plastic extends over the surface 14 of the wafer 12 and extends over the metallization strips **16*a* and 16*b*. The plastic layer 20 is of a material which can be applied to the semiconductor wafer 12 without adversely affecting the active devices in the wafer and which can be readily provided with openings therethrough using standard photolithographic techniques. It has been found that a polyimide resin is suitable for the plastic layer 20. A layer 22 of silicon oxide is provided on the plastic layer 20**.

The plastic layer 20 and the silicon oxide layer 22 are provided with aligned openings therethrough, such as the openings 24 and 26. As shown, the opening 24 extends to an area of the surface 14 of the wafer 12 where a contact of transistor 30 exists, and the opening 26 extends to the metallization strip **16*b***.

A film of an electrically conductive metal, such as aluminum, is provided on the surface of the silicon oxide layer 22. This metal film is also in the form of a pattern of narrow strips, such as the strip 28. As shown, the metallization strip 28 extends into the openings 24 and 26 in the plastic layer 20 and silicon oxide layer 22 and contacts the wafer surface 14 and metallization strip **16*b* respectively. Thus, the metallization strip 28 electrically connects a contact of the transistor 30 in the wafer 14 to the metallization strip 16*b*. As can be seen in FIG. 1, the metallization strip 28 crosses over the metallization 16*a* on the wafer surface 14 but is electrically insulated from the metallization strip 16*a* by the plastic layer 20 and the silicon oxide layer 22. Although only one metallization strip is shown on the surface silicon oxide layer 22, the metallization pattern on the surface of the silicon oxide layer can include additional metallization strips as may be necessary to make the desired interconnection. The metallization strips which are provided on the silicon oxide layer 22 are those which have to cross over a metallization strip on the wafer surface 14** in order to make the desired interconnection.

In the semiconductor device 10 the plastic layer 20 provides a pinhole-free insulating layer to prevent any undesired electrical interconnections between the two levels of the metallization patterns. The silicon oxide film 22 on the plastic layer 20 acts as an adhesive since it adheres well to the plastic layer 20 and the second level metallization pattern adheres well to the silicon oxide layer. In addition, in the event that pinholes are accidentally formed in the plastic layer 20, the silicon oxide layer 22 will fill such pinholes and thereby prevent any undesired interconnections between the levels of the metallization patterns.

Figure 3:
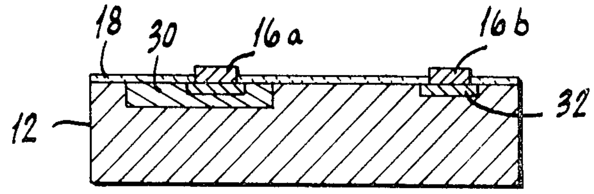
FIGS. 3–5 are sectional views showing the various steps of making the semiconductor device.

To make the semiconductor device 10 one starts with a flat wafer 12 of a semiconductor material, such as silicon, having a plurality of active devices, such as the transistor 30 and the diodes 32 and 34, formed in a surface thereof. The active devices can be formed in the wafer using any technique well known in the art. As shown in FIG. 3, the metallization pattern which includes the metallization strips **16*a* and 16*b* is then formed on the wafer 12. This is generally achieved by first coating the surface of the wafer 12 with a layer 18 of silicon oxide. The silicon oxide layer 18 can be formed by either oxidizing the surface of the wafer 12 or by pyrolytically decomposing a gas containing silicon and oxygen, such as a mixture of silane and oxygen, and depositing the silicon oxide so formed on the surface of the wafer. Openings are then formed in the silicon oxide layer 18 at the positions where the metallization pattern is to make contact with the active devices in the wafer. This is generally achieved by coating the silicon oxide layer 18 with a masking layer of a resist material having openings therein where the openings in the silicon oxide layer are to be provided. The exposed areas of the silicon oxide layer are then etched away, such as with hydrofluoric acid, to provide the openings in the silicon oxide layer. The masking layer is then removed with a suitable solvent. A film of the metal of the metallization pattern is then coated over the silicon oxide layer 18 and the exposed areas of the surface of the wafer. A masking layer of a resist material is then coated over the portions of the metal layer which are to form the metallization pattern, such as the metallization strips 16*a* and 16*b***. The exposed area of the metal layer is then removed using a etchant suitable for the particular metal of the metal layer thereby forming the metallization pattern. The masking layer is then removed with a suitable solvent.

Figure 4:
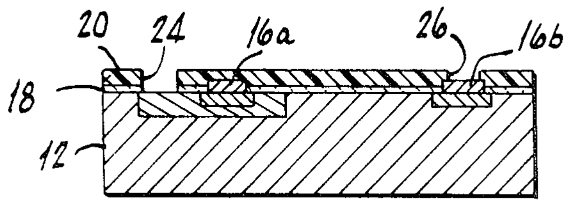

As shown in FIG. 4, the plastic layer 20 is then coated over the silicon oxide layer 18 and the metallization pattern. The plastic layer, in liquid form, may be applied by painting, spraying or by placing a pool of the plastic on the wafer and whirling it to spread the plastic uniformly over the silicon oxide layer 18 and the metallization pattern. After the plastic is allowed to dry, any openings to be provided in the plastic layer, such as the openings 24 and 26, are formed. This is achieved by coating the plastic layer 20 with a masking layer of a resist material in which openings have been created by standard techniques where the openings in the plastic layer are to be formed. The exposed area of the plastic layer is then removed using an etchant suitable for the particular plastic used. If the plastic layer 20 is polyimide, a strong alkaline solution, such as potassium hydroxide or sodium hydroxide, can be used to dissolve the polyimide for forming the openings therein. The plastic layer 20 is then cured by heating it at a temperature and for a time necessary to cure the particular plastic used. However, the curing temperature used must be low enough so as to not adversely affect the active devices in the wafer 12. The polyimide resins can be cured at a temperature of between 200° C. and 400° C. which will not adversely affect the active devices. At 200° C. the polyimide can be cured in 2 hours and at 400° C. it can be cured in 10 minutes.

Figure 5:
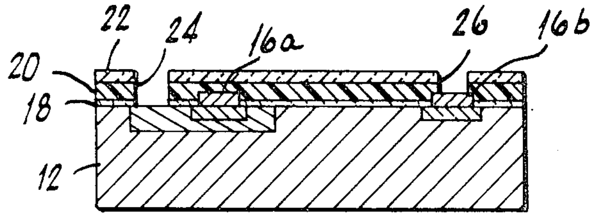

The silicon oxide layer 22 is then coated over the surface of the plastic layer 20 as shown in FIG. 5. This can be achieved by pyrolytically decomposing a gas containing silicon and oxygen, such as a mixture of silane and oxygen, and depositing the resultant silicon oxide on the plastic layer. The silicon oxide layer so formed will also coat the exposed surface in the openings in the plastic layer 20. The portions of the silicon oxide layer 22 in the openings in the plastic layer are then removed. This is achieved by coating the silicon oxide layer 22 with a masking layer of a resist material having openings therein over the openings in the plastic layer. The exposed portions of the silicon oxide layer 22 are then removed with a suitable etchant, such as hydrofluoric acid. Where the opening in the plastic layer extends to the silicon oxide layer 18, such as the opening 24, this etching operation will also remove the exposed portion of the silicon oxide layer 18 to expose the surface of the wafer.

A metal layer is then coated over the silicon oxide layer 22, such as by evaporating the metal in a vacuum and depositing the vapors on the silicon oxide layer. This metal layer will also coat the openings in the silicon oxide layer 22 and plastic layer

20 and the surface of the bottom of the openings. The metal layer is then formed into the metallization pattern which includes the metallization strip 28. This is achieved by applying a masking layer of a resist material over the portions of the metal layer which are to form the metallization pattern. The exposed portions of the metal layer are then removed by using an etchant suitable for the particular metal of the metal layer. The masking layer is then removed with a suitable solvent. This forms the semiconductor device 10 such as shown in FIG. 1.

I claim:

1. A semiconductor device comprising
   - a body of a semiconductor material;
   - a first metal film on said body, said first metal film being in the form of a pattern including interconnecting strips;
   - a layer of a plastic on said body, said plastic layer extending over said first metal film pattern and over the portions of the body between the first metal film pattern;
   - A layer of silicon oxide on the entire surface of said plastic layer, and
   - a second metal film on said silicon oxide layer, said second metal film being in a pattern including interconnecting strips.
2. A semiconductor device in accordance with claim 1 in which at least one of the interconnecting strips of the pattern of the second metal film crosses over at least one of the strips of the pattern of the first metal film.
3. A semiconductor device in accordance with claim 2 including a layer of silicon oxide on a surface of said body and having openings therethrough, and the interconnecting strips of the pattern of the first metal film are on said silicon oxide layer and extend into the openings in the said silicon oxide layer.
4. A semiconductor device in accordance with claim 3 including at least one set of aligned openings in the first mentioned silicon oxide layer and the plastic layer and the second metal film extends into said opening and contacts the surface at the bottom of the opening.
5. A semiconductor device in accordance with claim 1 in which the plastic is polyimide.

* * * * *